United States Patent [19]

Takeuchi et al.

[11] Patent Number: 5,691,594

[45] Date of Patent: *Nov. 25, 1997

[54] PIEZOELECTRIC/ELECTROSTRICITVE ELEMENT HAVING CERAMIC SUBSTRATE FORMED ESSENTIALLY OF STABILIZED ZIRCONIA

[75] Inventors: Yukihisa Takeuchi, Aichi-ken; Koji Kimura, Nagoya, both of Japan

[73] Assignee: NGK Insulators, Ltd., Japan

[*] Notice: The term of this patent shall not extend beyond the expiration date of Pat. No. 5,430,344.

[21] Appl. No.: 444,930

[22] Filed: May 19, 1995

Related U.S. Application Data

[63] Continuation of Ser. No. 239,856, May 9, 1994, Pat. No. 5,430,344, which is a continuation of Ser. No. 912,920, Jul. 14, 1992, abandoned.

[30] Foreign Application Priority Data

| Jul. 18, 1991 | [JP] | Japan | 3-203831 |
| Oct. 3, 1991 | [JP] | Japan | 3-283494 |
| Mar. 21, 1992 | [JP] | Japan | 4-09472 |

[51] Int. Cl.⁶ ............................................. H01L 41/08
[52] U.S. Cl. ........................ 310/330; 310/328; 310/358
[58] Field of Search ................................. 310/357–359, 310/330, 332, 328, 346, 365, 366; 252/62.9

[56] References Cited

U.S. PATENT DOCUMENTS

| 3,114,849 | 12/1963 | Poschenrieder | 310/328 |
| 3,509,387 | 4/1970 | Thorn et al. | 310/331 |
| 4,564,851 | 1/1986 | Nilsson et al. | 310/330 |
| 4,638,206 | 1/1987 | Tsunooka et al. | 310/330 |
| 4,649,313 | 3/1987 | Ogawa et al. | 310/366 |
| 4,680,595 | 7/1987 | Cruz-Uribe et al. | 346/140 R |
| 4,697,118 | 9/1987 | Harnden, Jr. et al. | 310/331 |
| 4,742,260 | 5/1988 | Shimizu et al. | 310/330 |
| 4,742,264 | 5/1988 | Ogawa | 310/366 |
| 4,769,570 | 9/1988 | Yokoyama et al. | 310/358 |
| 4,780,639 | 10/1988 | Shirasu | 310/328 |
| 4,783,821 | 11/1988 | Muller et al. | 310/332 |
| 4,812,698 | 3/1989 | Chida et al. | 310/366 |
| 4,825,227 | 4/1989 | Fischbeck et al. | 310/330 |
| 4,906,840 | 3/1990 | Zdeblick et al. | 310/328 |
| 4,981,823 | 1/1991 | Crutchley et al. | 501/123 |
| 5,089,455 | 2/1992 | Ketcham | 501/104 |
| 5,126,615 | 6/1992 | Takeuchi et al. | 310/330 |
| 5,210,455 | 5/1993 | Takeuchi et al. | 310/328 |
| 5,376,856 | 12/1994 | Takeuchi et al. | 310/328 |
| 5,376,857 | 12/1994 | Takeuchi et al. | 310/328 |
| 5,430,344 | 7/1995 | Takeuchi et al. | 310/330 |

FOREIGN PATENT DOCUMENTS

| 0408305 | 1/1991 | European Pat. Off. | 310/358 |
| 0408306 | 1/1991 | European Pat. Off. | 310/358 |
| 0455342 | 1/1991 | European Pat. Off. | 310/358 |
| 2570223 | 11/1986 | France . | |
| 58-196069 | 11/1983 | Japan . | |
| 59-32182 | 2/1984 | Japan . | |
| 59-175777 | 10/1984 | Japan . | |
| 61-253873 | 11/1986 | Japan . | |
| 62-213399 | 9/1987 | Japan | 310/358 |
| 62-198190 | 12/1987 | Japan . | |
| 62-298189 | 12/1987 | Japan . | |
| 62-298190 | 12/1987 | Japan . | |
| 63-72171 | 4/1988 | Japan . | |
| 63-72172 | 4/1988 | Japan . | |
| 63-285983 | 11/1988 | Japan . | |
| 64-783 | 1/1989 | Japan . | |
| 3-128680 | 5/1991 | Japan . | |
| 2161647 | 1/1986 | United Kingdom | 310/346 |

*Primary Examiner*—Mark O. Budd
*Attorney, Agent, or Firm*—Parkhurst, Wendel & Burr, L.L.P.

[57] ABSTRACT

A piezoelectric/electrostrictive element including a thin ceramic substrate, and a piezoelectric/electrostrictive portion formed on the ceramic substrate by a film forming technique without an adhesive agent, the piezoelectric/electrostrictive portion consisting essentially of a plurality of electrodes and at least one piezoelectric/electrostrictive layer. The ceramic substrate is formed of a material which includes as a major component zirconia having a crystal phase that is stabilized by addition of at least one compound selected from the group consisting of: yttrium oxide, ytterbium oxide, cerium oxide, calcium oxide and magnesium oxide.

35 Claims, 8 Drawing Sheets

PIEZOELECTRIC/ELECTROSTRICITVE ELEMENT HAVING CERAMIC SUBSTRATE FORMED ESSENTIALLY OF STABILIZED ZIRCONIA

This is a continuation of application Ser. No. 08/239,856 filed May 9, 1994, now U.S. Pat. No. 5,430,344 now allowed which in turn is a continuation of application Ser. No. 07/912,920 filed Jul. 14, 1992, now abandoned.

BACKGROUND OF THE INVENTION

1. Field of the Invention

The present invention relates to a uni-morph, bi-morph or other types of piezoelectric or electrostrictive elements which undergoe displacement in the form of bending, deflection or flexure and which can be used for ink jet print heads, microphones, sounding bodies (such as loudspeakers), various resonators or vibrators, sensors, and other components or devices. The term "element" used herein is an element capable of transducing or converting an electric energy into a mechanical energy, i.e., mechanical force, displacement, strain or vibrations, or transducing such a mechanical energy into an electric energy. Further, the element of the invention has a dielectric property in addition to a piezoelectric/electrostrictive property, and therefore can be used as a film-like capacitor element.

2. Discussion of the Prior Art

In the recent years, in the fields of optics and precision positioning or machining operations, for example, there have been widely used and increasingly demanded an element whose displacement can be controlled for adjusting or controlling an optical path length or the position of a member or component of a device, on the order of fractions of a micron (μm), and a detecting element adapted to detect infinitesimal displacement of a subject as an electric change. To meet this need, there have been developed various piezoelectric or electrostrictive actuators or sensors utilizing a piezoelectric or electrostrictive material such as a ferroelectric material, which exhibits the reverse or converse piezoelectric effect or the electrostrictive effect, in which such a piezoelectric or electrostrictive material produces a mechanical displacement upon application of a voltage or electric field thereto, or which exhibits the piezoelectric effect in which the piezoelectric material produces a voltage or electric field upon application of pressure or mechanical stress.

For example, an ink jet print head uses a piezoelectric/electrostrictive element of a conventional uni-morph or bi-morph type, which is required to permit a high-quality high-speed printing operation. To this end, developments have been made to reduce the size and required drive voltage of the piezoelectric/electrostrictive element, and improve the operating response of the element.

A piezoelectric or electrostrictive element of the above type is carried by a substrate, which functions as an oscillator or transducer plate. For assuring sufficient amount and force of bending or flexural displacement of the substrate or plate, it is important to reduce the thickness of the substrate, on the one hand. On the other hand, however, the reduction in the substrate thickness undesirably results in a decrease in the mechanical strength of the substrate. In addition, the piezoelectric or electrostrictive element of the conventional uni-morph or bi-morph type is unsatisfactory in its operating reliability since planar members such as piezoelectric/electrostrictive plates which constitute the element are bonded to each other by means of adhesives, for example.

SUMMARY OF THE INVENTION

It is therefore a first object of the present invention to provide a piezoelectric/electrostrictive element which undergoes a sufficiently large amount of displacement and generates a large force by application of a relative low voltage, and which has improved strength and excellent operating response and reliability and is suitably used for ink jet print heads, microphones, sounding bodies (such as loudspeakers), and various oscillators and vibrators, and for various sensors such as an acceleration sensor, a pressure sensor, a vibration sensor or an angular velocity sensor.

It is a second object to provide a piezoelectric/electrostrictive element which ensures increased strength of adhesion between its piezoelectric/electrostrictive portion and substrate, permitting the displacement, distortion or strain occurring at the piezoelectric/electrostrictive portion to be effectively transmitted to the substrate.

The first object may be accomplished according to a first aspect of the present invention, which provides a piezoelectric/electrostrictive element including a thin ceramic substrate, and a piezoelectric/electrostrictive portion formed on the ceramic substrate by a film forming technique without an adhesive agent, the piezoelectric/electrostrictive portion consisting essentially of a plurality of electrodes, and at least one piezoelectric/electrostrictive layer which is heat-treated, wherein the improvement comprises the ceramic substrate formed of a material which includes as a major component zirconia having a crystal phase that is stabilized by addition of at least one compound selected from the group consisting of: yttrium oxide, ytterbium oxide, cerium oxide, calcium oxide and magnesium oxide.

The first object may also be accomplished according to a second aspect of the invention, which provides a piezoelectric/electrostrictive element including a thin ceramic substrate, and a piezoelectric/electrostrictive portion formed on the ceramic substrate by a film forming technique without an adhesive agent, the piezoelectric/electrostrictive portion consisting essentially of a plurality of electrodes, and at least one piezoelectric/electrostrictive layer which is heat-treated, wherein the improvement comprises: the ceramic substrate formed of a material which includes as a major component zirconia having a crystal phase that is partially stabilized by addition of at least one compound selected from the group consisting of: yttrium oxide, cerium oxide, magnesium oxide and calcium oxide, the crystal phase consisting essentially of one of a tetragonal phase and a combination of at least two kinds of the tetragonal phase, a cubic phase and a monoclinic phase.

The second object may be accomplished according to a third aspect of the invention, which provides a piezoelectric/electrostrictive element including a thin ceramic substrate, and a piezoelectric/electrostrictive portion formed on the ceramic substrate by a film forming technique without an adhesive agent, the piezoelectric/electrostrictive portion consisting essentially of a plurality of electrodes, and at least one piezoelectric/electrostrictive layer which is heat-treated, wherein the improvement comprises: the ceramic substrate formed of a material which includes as a major component zirconia having a crystal phase that is partially stabilized by addition of at least one compound selected from the group consisting of: yttrium oxide, cerium oxide, magnesium oxide and calcium oxide, the crystal phase consisting essentially of one of a tetragonal phase and a combination of at least two kinds of the tetragonal phase, a cubic phase and a monoclinic phase, the ceramic substrate having a surface roughness (Ra) within a range of 0.03–0.9 μm.

In the present piezoelectric/electrostrictive elements, the piezoelectric/electrostrictive portion which may consist of a plurality of laminated films (two electrode films and a film-like piezoelectric/electrostrictive layer interposed therebetween) is formed on the thin ceramic substrate. Accordingly, the present element provides a relatively large amount of displacement by application of a relatively low voltage, with a relatively large magnitude of force or electric potential generated, and has an improved operating response. Since the piezoelectric/electrostrictive portion may be easily formed in the form of electrode and piezoelectric/electrostrictive films or patterns on the ceramic substrate by a thick-film forming technique, for example, without using adhesives, any desired number of piezoelectric/electrostrictive units may be integrated on a single substrate to form a highly integrated piezoelectric/electrostrictive element.

Further, the ceramic substrate which carries thereon the piezoelectric/electrostrictive portion is formed principally of zirconia which is fully stabilized or partially stabilized by addition of at least one compound selected from the group consisting of yttrium oxide, ytterbium oxide, cerium oxide, calcium oxide, and magnesium oxide, or at least one compound selected from the group consisting of yttrium oxide, cerium oxide, magnesium oxide and calcium oxide. The use of the thus stabilized zirconia for the ceramic substrate provides the following advantages: i) the substrate formed of the stabilized zirconia has high degrees of mechanical strength and toughness even with the small thickness thereof; ii) thermal stresses produced during heat-treatment of the substrate with a laminar piezoelectric/electrostrictive material are relatively small; and iii) the stabilized zirconia undergoes a relatively small chemical reaction with the piezoelectric/electrostrictive material. These advantages i)-iii) lead to excellent operating characteristics of the piezoelectric/electrostrictive element obtained.

As well known in the art, it is difficult to use pure zirconia for producing thin plates or substrates, since the pure zirconia undergoes phase transformations between monoclinic and tetragonal phases at around 1000° C., which result in undesirable fracture of ceramics produced. To avoid such phase transformations, the properly selected compound or compounds as indicated above may be added so as to fully or partially stabilize the crystal phase of the zirconia. Partially-stabilized zirconia is the thus stabilized zirconia a part of which is allowed to undergo phase transformations. While the zirconia may be either fully or partially stabilized according to the first aspect of the invention, it is particularly desirable to provide partially-stabilized zirconia which exhibits high degrees of mechanical strength and toughness due to the phase transformation induced by stress applied thereto, that is, due to a stress-induced transformation toughening mechanism, for example. The partially-stabilized zirconia having these advantages may consist essentially of one of a tetragonal crystal phase, and a combination of at least two kinds of the tetragonal crystal phase, a cubic crystal phase and a monoclinic crystal phase, such as a combination of the cubic and tetragonal phases. In the piezoelectric/electrostrictive element which is formed without adhesives as a laminar structure of the piezoelectric/electrostrictive layer(s), electrode films and substrate, the partially-stabilized zirconia as described above is particularly favorably used as a material for the substrate, so that the element undergoes a relatively large amount of displacement and generates a relatively large magnitude of force or electric potential.

Preferably, the piezoelectric/electrostrictive layer formed of a material which includes a mixture of lead magnesium niobate, lead nickel niobate and lead zirconate titanate as a major component or a mixture of lead magnesium niobate and lead zirconate titanate as a major component is used in combination with the partially stabilized zirconia substrate as described above. During the heat-treatment of such piezoelectric/electrostrictive layer formed by a thick-film forming technique on the substrate, this layer undergoes a comparatively small reaction with the substrate, and is therefore almost free from a change in the composition of the layer and from occurrence of a crystal phase of pyrochlore, for example. Thus, the piezoelectric/electrostrictive layer having desired material and crystal structure may be advantageously obtained by using the above-indicated compounds as the major component.

To enable the present piezoelectric element to provide a relatively large amount of displacement by application of a relatively low voltage with a relatively large magnitude of force or electric potential generated, the piezoelectric/electrostrictive portion has a thickness not larger than 100 µm, preferably not larger than 50 µm, while the ceramic substrate has a thickness not larger than 50 µm, preferably not larger than 30 µm, more preferably not larger than 10 µm.

In the piezoelectric/electrostrictive element according to the first aspect of the invention, the substrate is preferably formed principally of zirconia that is stabilized by yttrium oxide, which is added to the substrate material in an amount of 1-30 mole %, preferably 1.5-6 mole %, and more preferably 2-4 mole %. The thus formed substrate has a sufficiently high mechanical strength even with the relatively small thickness thereof. To assure the high mechanical strength of the substrate, the average crystal grain size of the substrate is held within a range of 0.05-3 µm, desirably not larger than 1 µm.

In the piezoelectric/electrostrictive element according to the second and third aspects of the invention, the substrate is preferably formed principally of zirconia that is partially stabilized by yttrium oxide, which is added to the substrate material in an amount of 2-7 mole %, preferably 2-4 mole %, so as to ensure a sufficiently high mechanical strength even with the relatively small thickness thereof. The crystal phase of the partially-stabilized zirconia is principally a tetragonal phase or a combination of at least two kinds of the tetragonal phase, a cubic phase and a monoclinic phase. Preferably, the crystal phase of the partially-stabilized zirconia is principally a tetragonal phase or a combination of the cubic and tetragonal phases. To assure the high mechanical strength of the substrate and stable existence of the above crystal phase, the average crystal grain size of the substrate is held within a range of 0.05-3 µm, desirably not larger than 1 µm.

To assure excellent piezoelectric/electrostrictive properties of the element, the electrodes and piezoelectric/electrostrictive layer(s) do not contain glass or other adhesive materials. Accordingly, the surface roughness of the substrate is an important factor for increasing adhesion between the piezoelectric/electrostrictive portion and the substrate, so that the distortion and stress occurring at the piezoelectric/electrostrictive layer can be effectively transmitted to the substrate that functions as an oscillator or transducer plate. In the piezoelectric/electrostrictive element according to the third aspect of the invention, the surface roughness of the ceramic substrate, which is represented by Ra, is held within a range of 0.03-0.9 µm, preferably within a range of 0.1-0.7 µm. Although the adhesion strength is increased if the surface roughness is larger than 0.9 µm, the flatness of the piezoelectric/electrostrictive portion is deteriorated, causing an uneven electric field to be applied to the piezoelectric layer, whereby the operating characteristics of the element are deteriorated. It is also significant to keep the surface roughness within the above range so as to ensure a sufficiently high strength of the substrate having a relatively small thickness of not larger than 50 μm.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
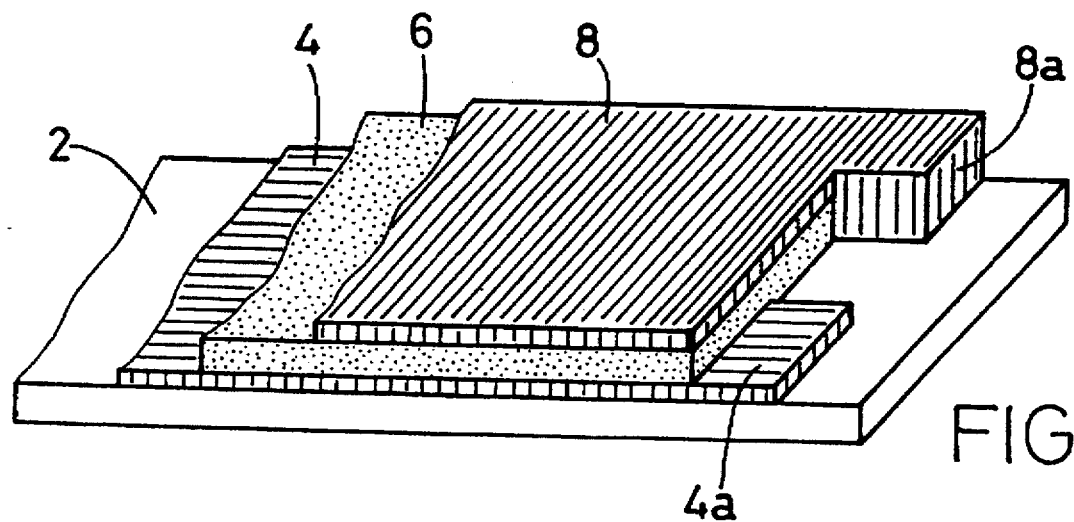
FIG. 1 is a fragmentary perspective view of one form of a piezoelectric/electrostrictive element of the invention in the form of a piezoelectric/electrostrictive actuator.

To further clarify the concept of the present invention, presently preferred forms of the piezoelectric/ electrostrictive element of the invention will be described by reference to the accompanying drawings, in which the same reference numerals are used to identify structurally or functionally identical or similar components or elements.

Referring first to FIG. 1, a piezoelectric/electrostrictive element or actuator of the invention has a ceramic substrate 2 in the form of a thin flat plate, and a piezoelectric/ electrostrictive portion formed on one of the opposite major surfaces of the substrate 2. The piezoelectric/electrostrictive portion has a laminar structure which consists of a first electrode film 4, a film-like piezoelectric/electrostrictive layer 6 and a second electrode film 8, which are laminated in the order of description by an ordinary film-forming method. The first and second electrode films 4, 8 are formed with respective terminal portions 4a, 8a which extend from one end of the piezoelectric/electrostrictive layer 6. In operation of the actuator, a voltage is applied between the first and second electrode films 4, 8 through the terminal portions 4a, 8a. The ceramic substrate 2 is formed principally zirconia which is stabilized (preferably partially stabilized) according to the present invention. This substrate 2 has a surface roughness (Ra) which is held within a range of 0.03–0.9 μm. Upon application of the voltage, the piezoelectric/electrostrictive layer 6 is exposed to an electric field, and the actuator generates a force or undergoes displacement in the form of a bending or deflection, in the direction perpendicular to the plane of the ceramic substrate 2, due to the transverse mode of converse piezoelectric effect or electrostrictive effect.

Figure 2:
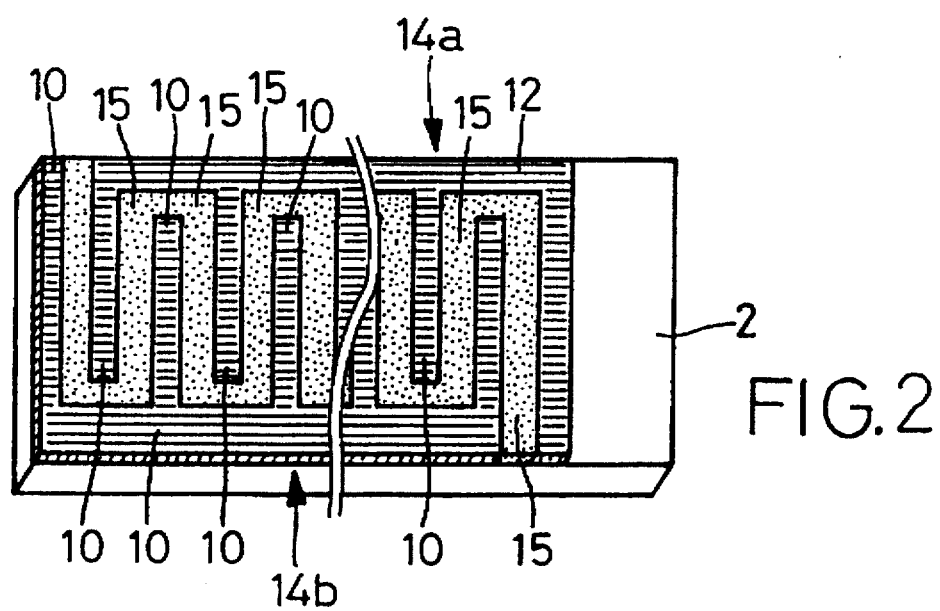
FIG. 2 is a fragmentary perspective view of another form of the actuator of the invention.

Another form of piezoelectric/electrostrictive actuator is shown in FIG. 2, wherein a pair of comb-like electrode patterns 14a, 14b are formed on one major surface of the ceramic substrate 2. Each electrode pattern 14a, 14b has a plurality of electrode strips 10 connected to each other by a connecting portion 12. Each electrode strip 10 of one of the two patterns 14a, 14b is disposed between the adjacent electrode strips 10 of the other pattern 14b, 14a, in spaced-apart relation with each other in the direction of extension of the connecting portion 12. Namely, the electrode strips 10 of the electrode pattern 14a and the strips 10 of the other electrode pattern 14b are disposed alternately in the direction of extension of the connecting portion 12. A piezoelectric/electrostrictive pattern 15 is also formed on the ceramic substrate 2, such that a space formed between the two comb-like electrode patterns 14a, 14b is filled with a piezoelectric/electrostrictive material of the pattern 15, as shown in FIG. 2. Namely, the pattern 15 has piezoelectric/ electrostrictive strips each of which is disposed between the adjacent electrode strips 10. Thus, the electrode strips 10 and the piezoelectric/electrostrictive strips are alternately disposed in contact with each other on the ceramic substrate 2. Upon application of an electric field to the piezoelectric/ electrostrictive pattern 15, the actuator generates a force or undergoes displacement by bending or deflecting, in the direction perpendicular to the plane of the ceramic substrate 2, due to the longitudinal mode of converse piezoelectric effect or electrostrictive effect.

Figure 3:
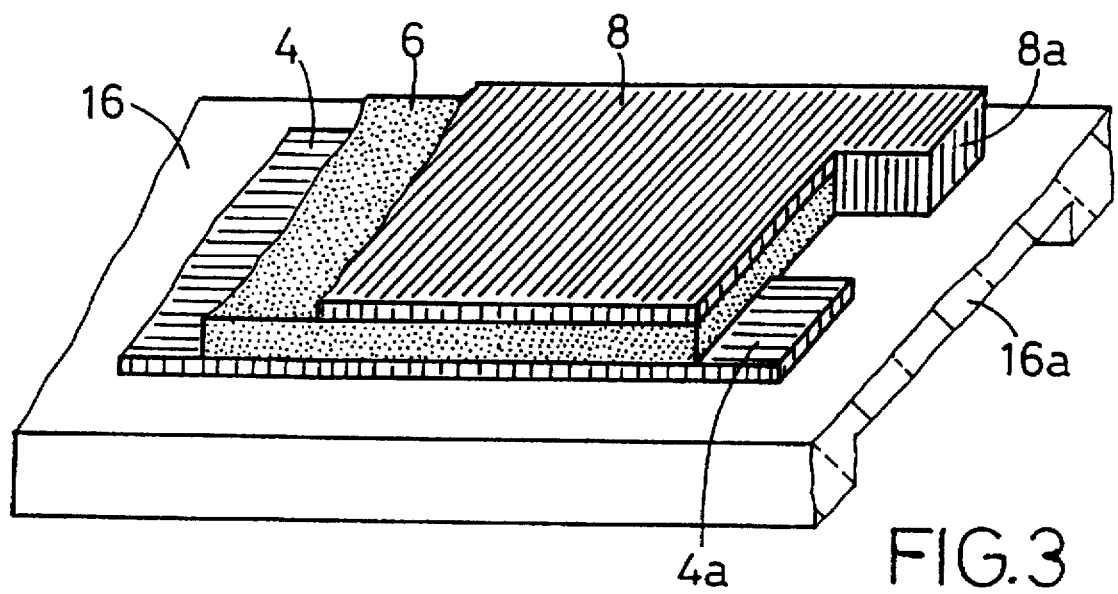
FIG. 3 is a fragmentary perspective view of a further form of the actuator of the invention.
Figure 4:
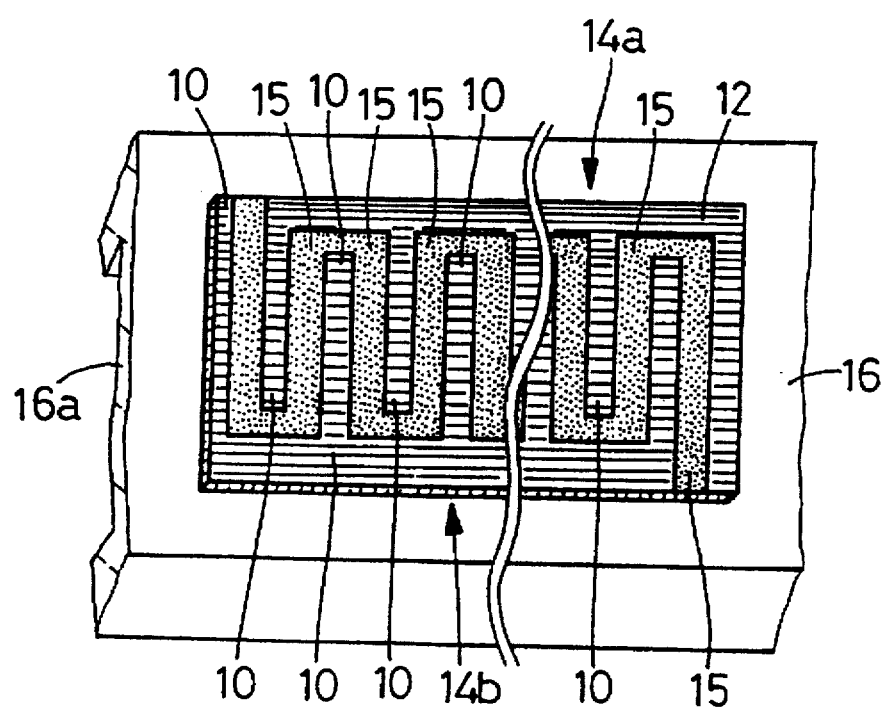
FIG. 4 is a fragmentary perspective view of a still further form of the actuator of the invention.

Referring next to FIGS. 3 and 4, there are shown modified forms of the piezoelectric/electrostrictive actuators of FIGS. 1 and 2, respectively, in respect of the configuration of the ceramic substrate 2. Namely, the actuators as shown in FIGS. 3 and 4 utilize a ceramic substrate 16 which consists of a thick-walled peripheral portion, and a thin-walled portion 16a which is surrounded by the thick-walled peripheral portion. On the thin-walled portion 16a of the substrate 16 are formed a piezoelectric/electrostrictive portion of the actuator which consists of the electrode films 4 and 8 and 14a and 14b and the piezoelectric/electrostrictive layer or pattern 6 and 15 respectively.

Figure 5:
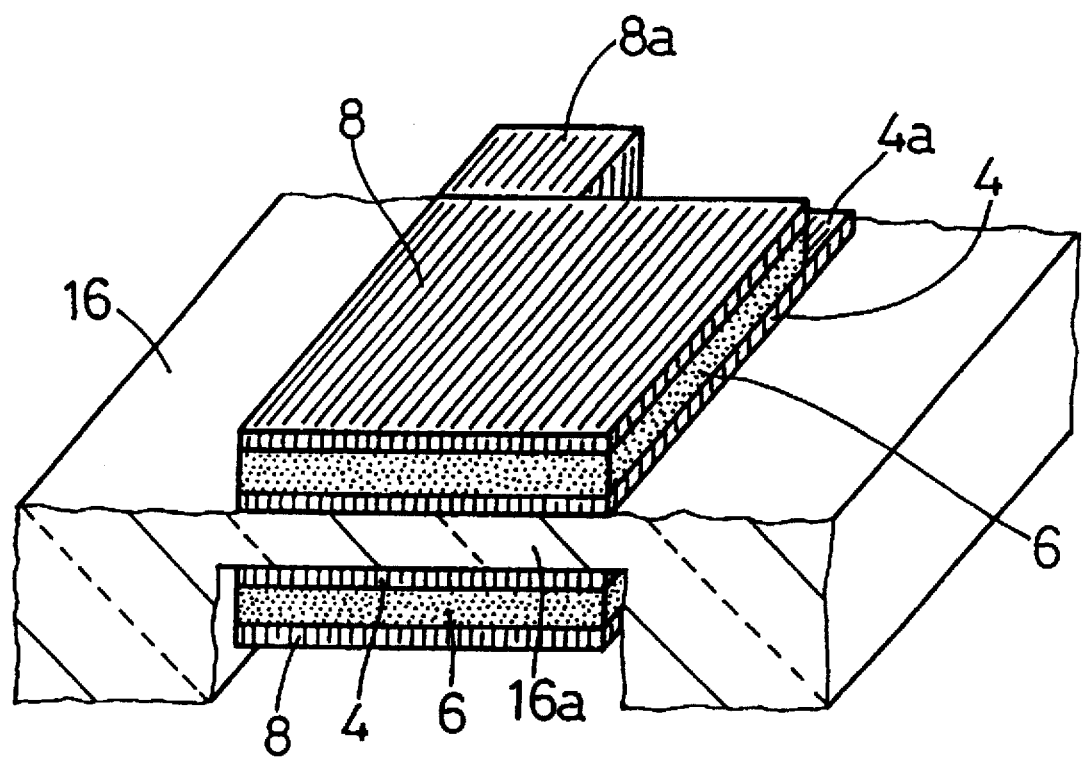
FIG. 5 is a fragmentary perspective view of a yet further form of the actuator of the invention.

A bi-morph type piezoelectric/electrostrictive actuator is illustrated in FIG. 5. This actuator has a Piezoelectric/ electrostrictive portion consisting of two piezoelectric/ electrostrictive units (4, 6, 8), which are formed on the opposite surfaces of the thin-walled portion 16a of the ceramic substrate 16.

Figure 6:
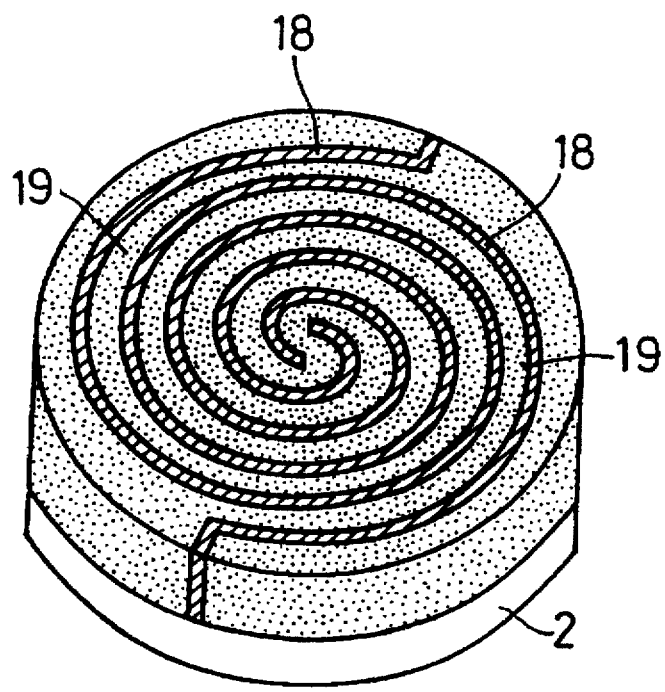
FIG. 6 is a fragmentary perspective view of another form of the actuator of the invention.

Referring to FIG. 6 showing another form of piezoelectric/electrostrictive actuator of the invention, a circular piezoelectric/electrostrictive portion which consists of an electrode pattern 18 and a piezoelectric/electrostrictive pattern 19 is formed on one major surface of the ceramic substrate 2. The electrode pattern 18 consists of two spiral electrode strips defining two spiral spaces which are filled by the piezoelectric/electrostrictive material 19.

Figure 7:
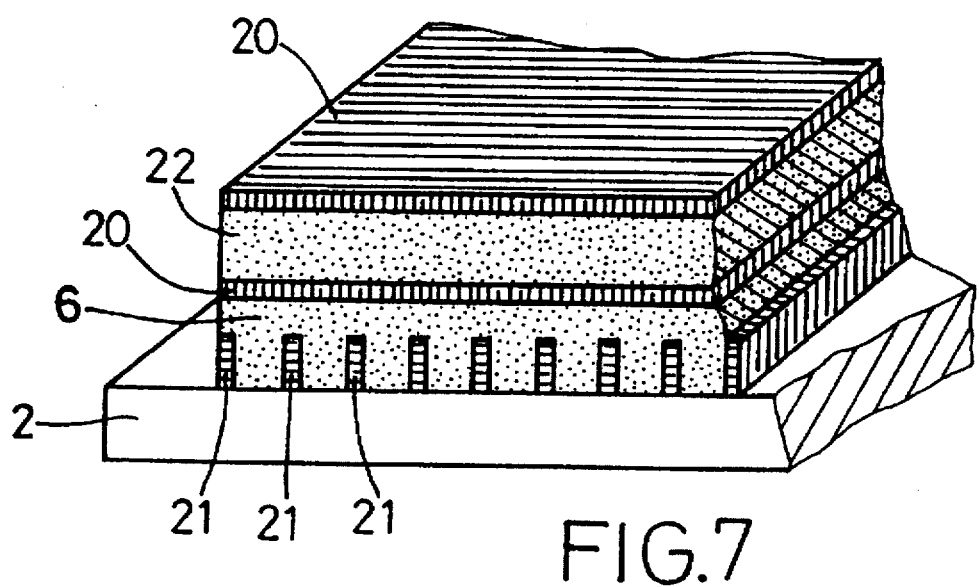
FIG. 7 is a fragmentary perspective view of a still another form of the actuator of the invention.

Referring to FIG. 7 through FIG. 11, there are illustrated further forms of actuators, each of which has a piezoelectric/ electrostrictive portion consisting of a plurality of piezoelectric/electrostrictive units formed on the ceramic substrate 2. These units may be laminated on the substrate 2 as shown in FIG. 7, or may be disposed in parallel with each other on the substrate 2 as shown in FIGS. 8–11.

In the actuator of FIG. 7, a piezoelectric/electrostrictive layer 6 is formed on one of the opposite surfaces of the ceramic substrate 2. A plurality of parallel electrode strips 21 are embedded in the piezoelectric/electrostrictive layer 6 such that the electrode strips 21 are spaced apart from each other. On the thus formed piezoelectric/electrostrictive unit (6, 21), there are formed an electrode film 20, film-like piezoelectric/electrostrictive layer 22 and another electrode film 20, which are laminated in the order of description. Thus, these two electrode films 20 and piezoelectric/electrostrictive layer 22 cooperate to constitute another piezoelectric/electrostrictive unit.

Figure 8:
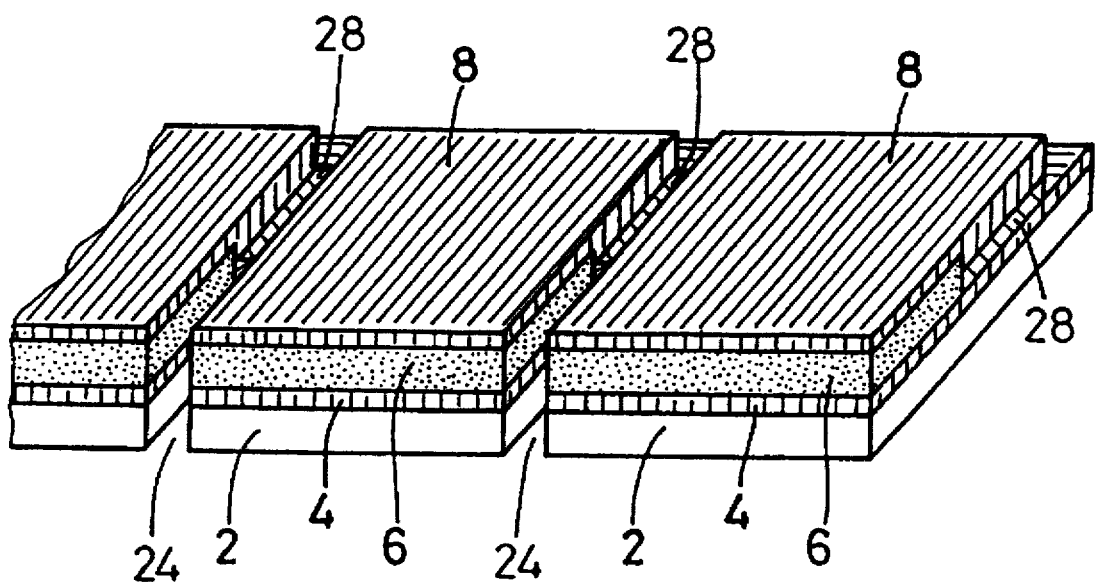
FIG. 8 is a fragmentary perspective view of a further form of the actuator of the invention.
Figure 9:
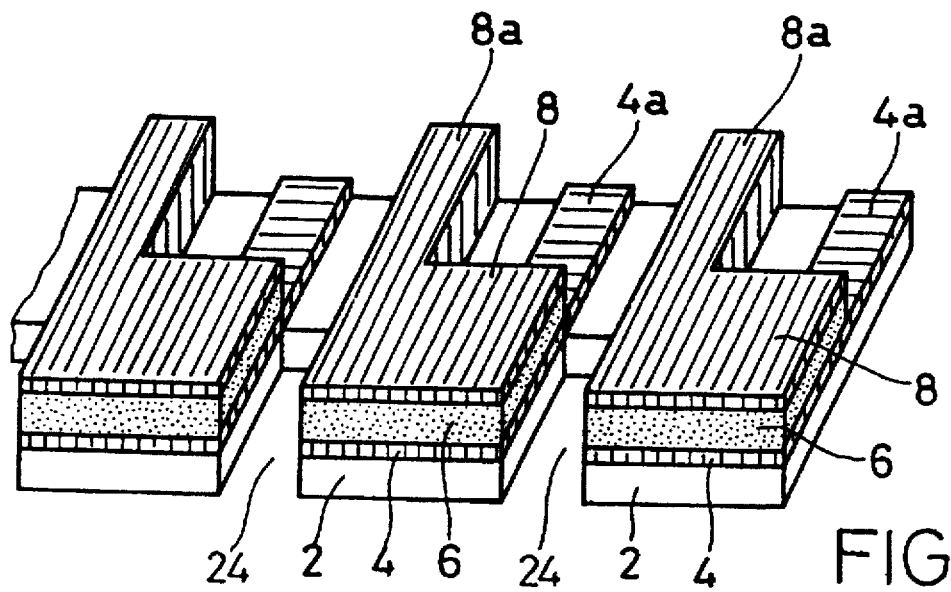
FIG. 9 is a fragmentary perspective view of a still further form of the actuator of the invention.
Figure 10:
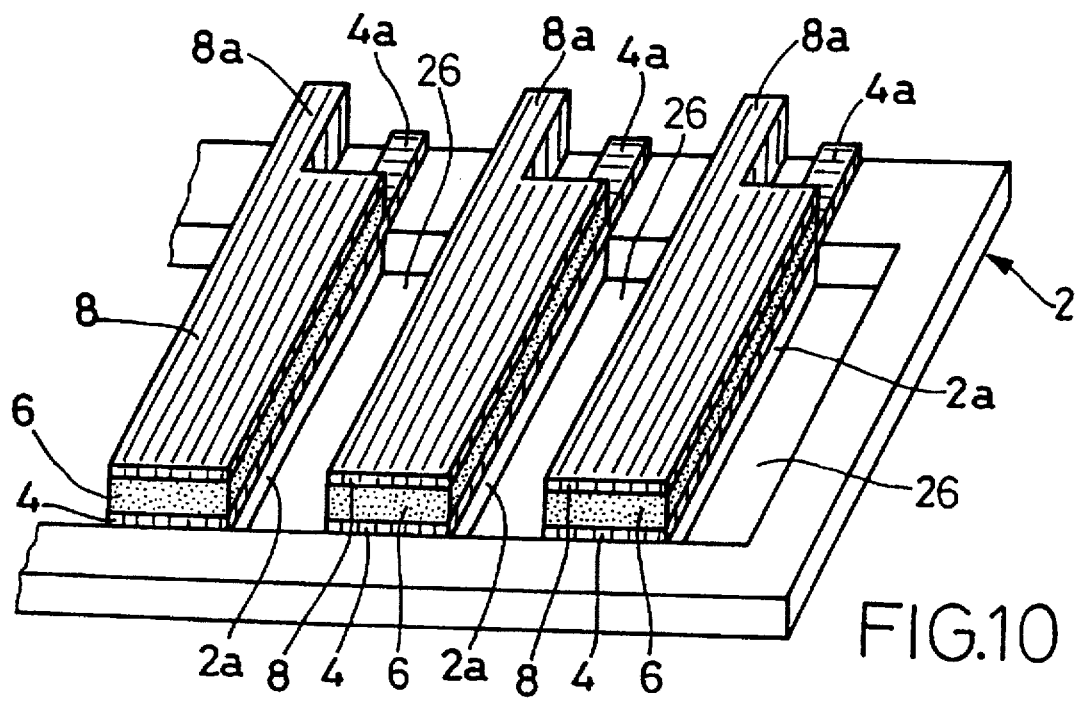
FIG. 10 is a fragmentary perspective view of a yet further form of the actuator of the invention.

In the actuators of FIGS. 8, 9 and 10, a plurality of piezoelectric/electrostrictive units (4, 6, 8) are formed in parallel with each other on one major surface of the ceramic substrate 2, such that the units (4, 6, 8) are spaced apart from each other in the longitudinal direction of the substrate 2. In the actuator of FIGS. 8 and 9, the piezoelectric/electrostrictive units (4, 6, 8) are separated from each other by rectangular slots 24 formed in respective portions of the ceramic substrate 2, each located between the adjacent piezoelectric/electrostrictive units. The actuator of FIG. 8 has insulating films 28 which cover a rear part of the exposed end face of the piezoelectric/electrostrictive layer 6, for electrically insulating the first and second electrode films 4, 8. In the actuator of FIG. 10, the ceramic substrate 2 has a plurality of elongate rectangular holes 26 formed therethrough at a suitable pitch in the longitudinal direction, so as to define a plurality of beam portions 2a. On each of the beam portions 2a of the substrate 2 is formed a piezoelectric/electrostrictive unit consisting of the first electrode film 4, film-like piezoelectric/electrostrictive layer 6 and second electrode film 8.

Figure 11:
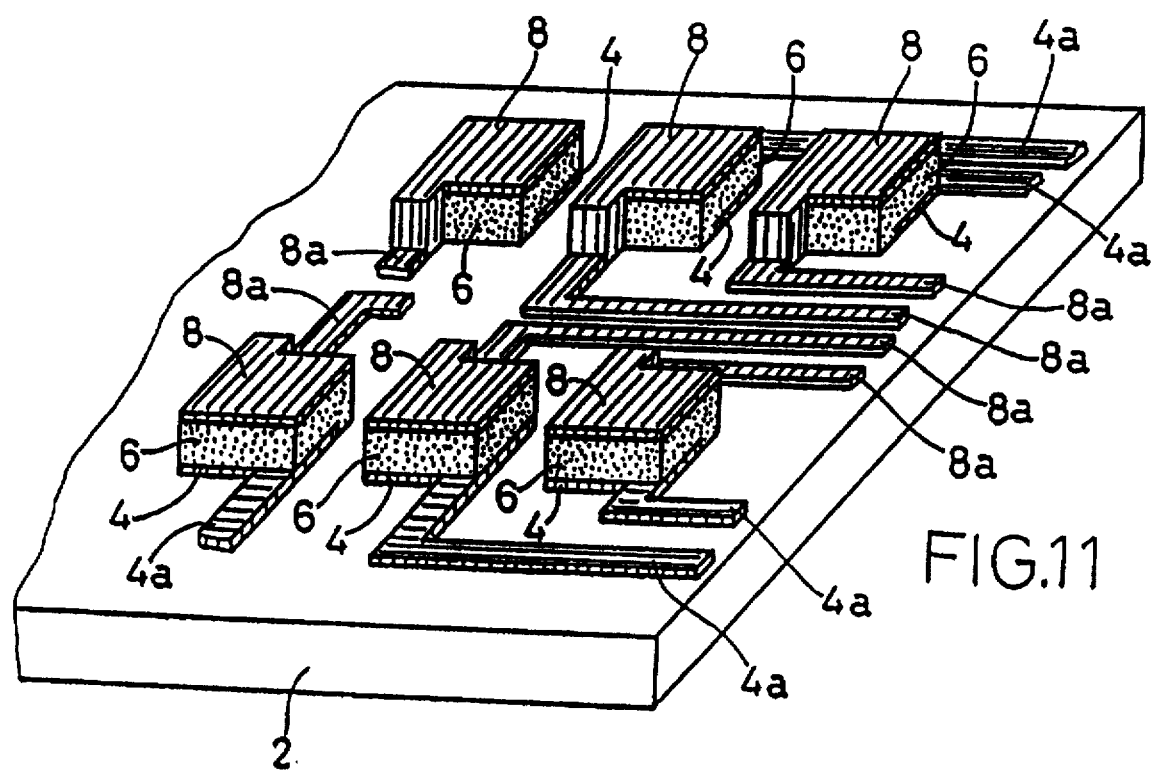
FIG. 11 is a fragmentary perspective view of another form of the actuator of the invention.

In the piezoelectric/electrostrictive actuator of FIG. 11, a plurality of piezoelectric/electrostrictive units are formed on a relatively large surface of the ceramic substrate 2, such that the units are spaced apart from each other at a suitable pitch. Each of these units consists of the first and second electrode films 4, 8 and the piezoelectric/electrostrictive layer 6 formed therebetween.

Figure 12:
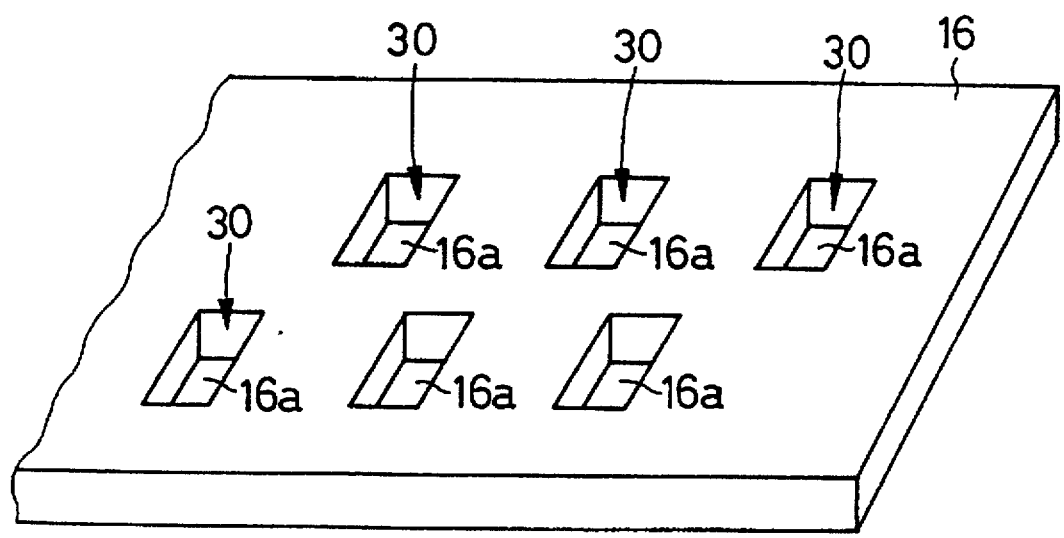
FIG. 12 is a fragmentary perspective view showing a rear surface of a substrate of an actuator as a modified form of the actuator of FIG. 11.
Figure 13:
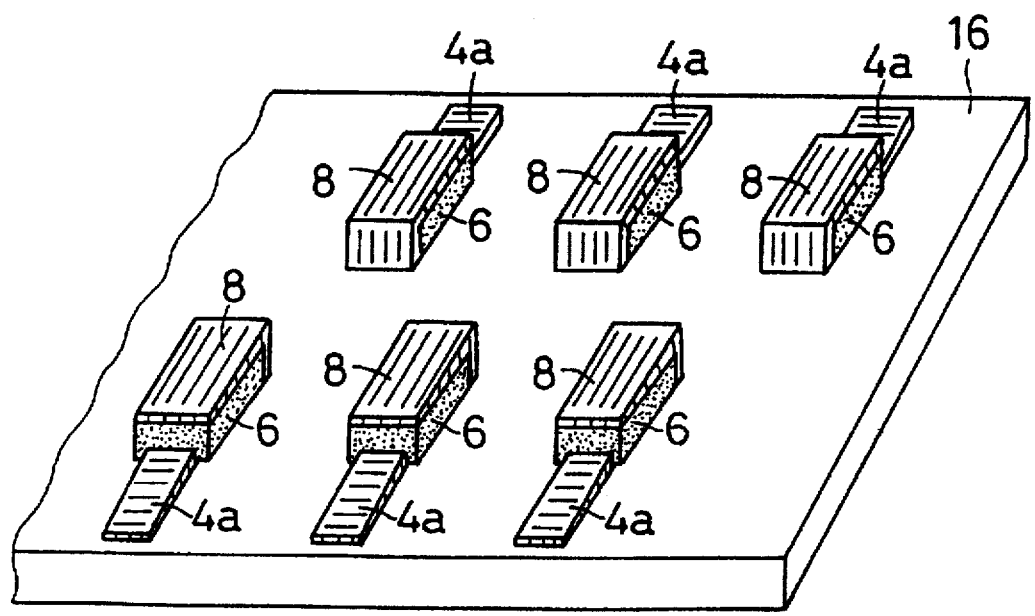
FIG. 13 is a fragmentary perspective view corresponding to that of FIG. 11, showing the modified form of the actuator having the substrate as shown in FIG. 12.

Referring further to FIGS. 12 and 13, there is shown a further form of actuator which is different from the preceding forms with regard to the configuration of the ceramic substrate 2 and the position or arrangement of the piezoelectric/electrostrictive units (4, 6, 8) disposed on the substrate 2. As is apparent from FIG. 12 showing a rear major surface of the ceramic substrate 16 having a relatively large thickness, a plurality of recesses 30 are formed in the rear surface of the substrate 16 in a zigzag fashion at a suitable pitch. The recesses 30 have respective bottom walls which give the thin-walled portions 16a of the substrate 16 which are arranged in the zigzag fashion. On these thin-walled portions 16a of the substrate 16, there are formed respective piezoelectric/electrostrictive actuator units (4, 6, 8) as shown in FIG. 13, such that the units are arranged in the zigzag fashion.

In operation of the thus constructed actuators as shown in FIGS. 1–13, a voltage is applied between the two electrode films of each piezoelectric/electrostrictive unit, whereby the piezoelectric/electrostrictive layer is exposed to an electric field, and undergoes a mechanical distortion induced by the electric field. Consequently, the actuators generate a force or undergo displacement by bending or deflecting, in the direction perpendicular to the plane of the ceramic substrate.

The ceramic substrate (2, 16) for carrying the piezoelectric/electrostrictive portion is formed of a material which includes as a major component zirconia having a crystal phase that is stabilized by a selected compound or compounds. The crystal phase of the zirconia partially stabilized by the selected compound(s) may consist essentially of a tetragonal phase or a combination or a mixture of at least two kinds of cubic, tetragonal and monoclinic phases. Preferably, the crystal phase of the partially stabilized zirconia consists essentially of the tetragonal phase or a combination of the cubic and tetragonal phases. It has been found that the operating characteristics of the above-described actuators, such as the force generated by the actuator or the amount of displacement of the actuator, are influenced by the properties of the substrate material which are exhibited during heat-treatment of the substrate for integration with the laminar piezoelectric/electrostrictive portion. These properties include the heat resistance, degree of chemical reaction with a piezoelectric/electrostrictive material through the electrode film, and mechanical strength against thermal stresses. The use of fully or partially stabilized zirconia for the ceramic substrate advantageously results in excellent operating characteristics of the actuators, e.g., a relatively large amount of displacement of the actuators with a relatively large magnitude of force generated.

The above-indicated compound or compounds for fully or partially stabilizing the zirconia is selected from the group consisting of: yttrium oxide, ytterbium oxide, cerium oxide, calcium oxide and magnesium oxide. The zirconia is partially or fully stabilized as desired, by addition of at least one of these compounds, that is, a selected one of the above-indicated oxides or a selected combination of two or more of these oxides. It is desirable to stabilize the zirconia by adding 1–30 mole %, preferably 1.5–6 mole %, of yttrium oxide or ytterbium oxide, 6–50 mole %, preferably 8–20 mole %, of cerium oxide, or 5–40 mole %, preferably 5–20 mole %, of calcium oxide or magnesium oxide. It is particularly recommended to use yttrium oxide in an amount of 1.5–6 mole %, more preferably 2–4 mole %. With the crystal phase of the zirconia partially stabilized by addition of the yttrium oxide in the above-indicated range, the ceramic substrate thus obtained exhibits particularly excellent properties.

The above-indicated compound or compounds for partially stabilizing the zirconia so that its crystal phase is principally a tetragonal phase or a combination of at least two kinds of cubic, tetragonal and monoclinic phases, such as a combination of cubic and tetragonal phases, is selected from the group consisting of: yttrium oxide, cerium oxide, magnesium oxide and calcium oxide. The zirconia is partially stabilized as desired, by addition of at least one of these compounds, that is, a selected one of the above-indicated oxides or a selected combination of two or more of these oxides. It is desirable to partially stabilize the zirconia by adding 2–7 mole % of yttrium oxide, 6–15 mole % of cerium oxide, or 5–12 mole % of magnesium oxide or calcium oxide. It is particularly recommended to use yttrium oxide as a partially stabilizing agent in an amount of 2–7 mole %, more preferably 2–4 mole %. The zirconia is partially stabilized by addition of the yttrium oxide in the above-indicated range, so that its crystal phase is principally the tetragonal phase or the combination of at least two kinds of cubic, tetragonal and monoclinic crystal phases, such as the combination of cubic and tetragonal phases, thereby assuring particularly excellent properties of the ceramic substrate. To assure stable existence of the tetragonal crystal phase which leads to increased strength of the substrate, the average crystal grain size of the ceramic substrate is preferably held within a range of 0.05–3 μm, more preferably not larger than 1 μm. The crystal phase heretofore referred to is identified by an X ray after the fired ceramic substrate is mirror-polished.

While yttrium oxide and magnesium oxide, for example, are generally known as compounds for stabilizing the zirconia substrate, the crystal phase thus stabilized is varied with the content of these compounds. However, the crystal phase is determined depending upon not only the content of these compounds, but also the crystal grain size of the zirconia powder, the crystal grain size of the zirconia ceramic produced by firing the zirconia powder, and the firing temperature and time relating to the firing operation. Where the yttrium oxide is used as a stabilizer, for example, the zirconia substrate obtained consists principally of a tetragonal crystal phase when (a) the content of the stabilizer added is within a range of 2–4 mole %, (b) the grain size of the zirconia powder is not larger than 0.1 μm, and (c) the crystal grain size of the ceramic (zirconia substrate) produced is not larger than 1 μm. While the firing temperature depends upon the substrate material used, the firing temperature and time are suitably selected to avoid the growth of zirconia grains. With all of these conditions satisfied, the zirconia substrate is prepared which consists principally of the stable tetragonal crystal phase. On the other hand, the crystal phase of the zirconia substrate is a combination of at least two kinds of cubic, tetragonal and monoclinic phases, when the content of the yttrium oxide added as the stabilizer is within a range of 2–7 mole % while the crystal grain size of the final ceramic product is not larger than 3 μm. The grain size of the ceramic is controlled to 2 μm or smaller to obtain the combination of cubic and tetragonal crystal phases. The desired crystal phases are not obtained if the above conditions are not fully satisfied. For example, if the content of the yttrium oxide is smaller than 2 mole %, the obtained zirconia substrate consists essentially of the monoclinic crystal phase. If the crystal grain sizes of the zirconia powder and the ceramic product are larger than the above-indicated upper limits, the stable tetragonal crystal phase is difficult to obtain.

Thus, the partially stabilized zirconia substrate of the present invention is produced by using the selected compound or compounds indicated above in the specified content(s) while using the zirconia powder having the average grain size of not larger 0.1 μm, and firing the powder material at a temperature of 1300°–1600° C.

The ceramic substrate may take the planar or flat configuration as shown in FIGS. 1 and 2, or may have at least one recess which has a bottom surface defining the thin-walled portion (16a) of the substrate (16) on which the piezoelectric/electrostrictive portion is formed, as shown in FIGS. 3 and 4. However, the latter type of the ceramic substrate with the recess(es) is preferred since only the portion of the substrate which is subject to the piezoelectric/electrostrictive displacement is thin-walled, without lowering the mechanical strength of the substrate. Further, the latter type is advantageous when a plurality of piezoelectric/electrostrictive actuator units are formed on respective thin-walled portions of the substrate, since the adjacent actuator units will not interfere with each other when these units are displaced or oscillated with the thin-walled portions, due to the presence of relatively thick-walled portions of the substrate interposed between the thin-walled portions. The dimensions of the recess(es) formed in the substrate (16) are preferably determined such that the length of each recess is 2–20 times larger than the width thereof. To assure sufficiently large displacement or force of the actuator, the piezoelectric/electrostrictive portion is desirably formed on the thin-walled portion (16a) of the substrate (16) over its surface area corresponding to 50–90% of the width of the recess.

For improving the operating response and increasing the amount of displacement of the actuator, the thickness of the thin ceramic substrate is generally not larger than 50 μm, preferably not larger than 30 μm, and more preferably not larger than 10 μm. For increased strength of the substrate, the average crystal grain size of the ceramic substrate is preferably held within a range of 0.05–3 μm, more preferably not larger than 1 μm.

The green sheet for the ceramic substrate may be fired before the piezoelectric/electrostrictive unit or units (4, 6, 8) is/are formed on the fired substrate. Alternatively, the unfired unit or units is/are formed on the green sheet for the ceramic substrate, by a suitable film-forming method as described below, and the unit or units is/are co-fired with the green sheet. For reducing the amount of warpage of the produced actuator and improving the dimensional and patterning accuracy of the piezoelectric/electrostrictive unit or units, it is desirable to form the unit or units on the fired ceramic substrate. In a preferred method of forming the ceramic substrate (16) having at least one recess, a first green sheet having at least one opening formed through its thickness is formed by using a mold or by machining process such as ultrasonic machining. A relatively thin second green sheet which provides at least one thin-walled portion of the substrate is superposed on the first green sheet, under heat and pressure, and then these green sheets are fired into the integrated ceramic substrate having high reliability. The material for the ceramic substrate which includes the stabilized zirconia as a major component may further contain as additives aluminum oxide or titanium oxide, and/or a sintering aid such as clay. It is desirable to adjust the composition and amount of the sintering aid so that the fired substrate does not contain silicon oxide (SiO or SiO$_2$) in an amount of 1% or larger by weight. The substrate containing an excessive amount of the silicon oxide is likely to excessively react with the piezoelectric/electrostrictive material during the heat-treatment, making it difficult to control the composition of the material.

The surface roughness of the thus formed ceramic substrate, which is represented by Ra, is controlled to be within a range of 0.03–0.9 μm, so that the substrate is responsive to the operating characteristics of the piezoelectric/electrostrictive portion formed thereon. Namely, the distortion or strain and stress occurring at the piezoelectric/electrostatic portion can be effectively transmitted to the substrate having the above range of surface roughness, and vice versa. Such adjustment of the surface roughness (Ra) is also effective to assure a desired mechanical strength of the relatively thin substrate.

The Piezoelectric/electrostrictive portion may be formed by a film-forming process as described below.

To form the electrode films (4, 8) and the Piezoelectric/electrostrictive layer (6) on the ceramic substrate (2, 16), it is possible to select any one of various known methods such as: thick-film forming process such as screen printing, spraying, dipping or coating; thin-film forming process such as ion-beam method, sputtering, vacuum vapor deposition, ion plating, CVD and plating. However, the other known methods may be used. For improved characteristics of the actuator produced, the film-like Piezoelectric/electrostrictive layer (6) is desirably formed by the thick-film forming process such as screen printing, spraying, dipping or coating, which permits easy formation of a film on the substrate by using a paste or slurry whose major component is a piezoelectric/electrostrictive ceramic powder. While the screen printing or photolithography may be used for pattering the electrode and piezoelectric/electrostrictive films, the pattern may be formed by removing unnecessary portions of the films by laser cutting, slicing, ultrasonic machining or other mechanical machining method.

The actuator as a whole, and the electrode and Piezoelectric/electrostrictive films and patterns may take any desired configurations depending upon the utility of the actuator, such as triangular, rectangular and other polygonal shapes, circular, elliptical and annular shapes, comb-like or lattice-like configurations, and any combinations of these shapes.

The electrode and piezoelectric films and patterns (4, 6, 8) formed on the ceramic substrate by the selected method described above may be either heat-treated in different steps for integration with the substrate after each of these films or patterns is formed, or concurrently heat-treated in one step for integration with the substrate after all of the films or patterns are formed into a laminar structure on the substrate. Where the thin-film forming process is used to form the electrode films or pattern, heat-treatment of the electrode films or pattern is not necessarily required.

The above-indicated heat-treatment for integration of the piezoelectric/electrostrictive portion with the ceramic substrate is generally effected at a temperature of about 900°–1400° C., preferably within a range between 1000° C. and 1400° C. To avoid a change in the composition of the piezoelectric/electrostrictive material during the heat-treatment of the piezoelectric/electrostrictive layer (6), it is desirable to control the heat-treatment atmosphere, by heating with the evaporation source of the piezoelectric/electrostrictive material. It is also recommended to employ a method of firing the piezoelectric/electrostrictive layer (6) while it is covered with a suitable covering member so that the surface of the layer (6) is not directly exposed to the firing atmosphere. The covering member is formed of a material similar to that of the ceramic substrate.

The electrode films (4, 8, 20) and pattern (14a, 14b, 18, 21) of the piezoelectric/electrostrictive portion may be formed of any electrically conductive material which can withstand oxidizing firing and heat-treatment atmospheres having a considerably high temperature as indicated above. For instance, the electrode films or pattern may be formed of a single metal, an alloy of metals, a mixture of a metal or alloy and an electrically insulating ceramic, or an electrically conductive ceramic. However, it is preferred that the electrode material has a major component which consists of a noble metal having a high melting point, such as platinum, palladium or rhodium, or an alloy such as silver-palladium alloy, silver-platinum alloy or platinum-palladium alloy. It is more preferable to use a cermet of platinum and the ceramic material for the substrate, so as to achieve improved adhesion of the electrode films to the substrate and reduce the thermal stresses produced during the above-described firing operation. It is still more preferable to use a cermet of platinum, the substrate material and the piezoelectric material. Where the cermets as described above are used, the content of the substrate material is preferably within a range of about 5–30% by volume, while the piezoelectric material is preferably within a range of about 5–20% by volume. Further, it is desirable to avoid using glass as an additive for the electrode, since the glass is likely to react with the piezoelectric/electrostrictive layer during heat-treatment thereof, resulting in deterioration of the operating characteristics of the actuator obtained.

While the thickness of the electrodes formed of such a conductive material as described above is suitably selected depending upon the application of the actuator, the electrode films used for the transverse-effect type piezoelectric/electrostrictive portion are formed with a thickness not larger than 20 µm, preferably not larger than 5 µm. The electrode pattern used for the longitudinal-effect type piezoelectric/electrostrictive portion is formed with a thickness of at least 3 µm, preferably at least 10 µm, more preferably at least 20 µm.

The piezoelectric/electrostrictive layer or pattern may be formed of any piezoelectric or electrostrictive material which produces a relatively large amount of strain or displacement due to the converse or reverse piezoelectric effect or the electrostrictive effect. The piezoelectric or electrostrictive material may be either a crystalline material or an amorphous material, and may be a semi-conductor material or a dielectric or ferroelectric ceramic material. Further, the piezoelectric or electrostrictive material may either require a treatment for initial polarization or poling, or may not require such a polarization treatment.

However, the piezoelectric/electrostrictive layer or pattern preferably has a composition whose major component is lead zirconate titanate (PZT), lead magnesium niobate (PMN), lead nickel niobate (PNN), lead manganese niobate, lead antimony stannate, lead zinc niobate, lead titanate, or a mixture or solid solution thereof. Further, a material (such as PLZT) containing an oxide or compound of lanthanum (La), barium (Ba), niobium (Nb), zinc (Zn), cerium (Ce), cadmium (Cd), chromium (Cr), cobalt (Co), antimony (Sb), iron (Fe), yttrium (Y), tantalum (Ta), tungsten (W), nickel (Ni), manganese (Mn), lithium (Li), strontium (Sr), calcium (Ca) and/or bismuth (Bi) may be added to the piezoelectric or electrostrictive composition whose major component consists of the materials indicated above. However, the addition of a glass material should be avoided, since the glass is likely to react with the lead-contained piezoelectric/electrostrictive material, making it difficult to establish a desired composition of the piezoelectric/electrostrictive layer, thereby causing undesirable variation and deterioration of the operating characteristics of the actuator obtained.

Among the piezoelectric/electrostrictive materials indicated above, it is recommended to use the material which includes a mixture of lead magnesium niobate (PMN), lead nickel niobate (PNN) and lead zirconate titanate (PZT) as a major component, or a mixture of lead magnesium niobate (PMN) and lead zirconate titanate (PZT) as a major component. In this respect, the content of the major component is usually 50 mole % or more. Particularly preferably used is the material including as a major component the mixture of the lead magnesium niobate and the lead zirconate titanate. The component(s) other than the major component is/are preferably selected from the piezoelectric/electrostrictive materials as indicated above. More preferably, the piezoelectric/electrostrictive layer is formed of a material which consists of a mixture of lead magnesium niobate, lead nickel niobate and lead zirconate titanate, or a mixture of lead magnesium niobate and lead zirconate titanate. Most preferably used is the material which consists of the mixture of lead magnesium niobate and lead zirconate titanate. The thus selected piezoelectric/electrostrictive material is not likely to react with the substrate material during heat-treatment thereof, and is therefore free from segregation of its components, whereby a desired composition or crystal structure can be easily obtained as a result of suitable treatment for maintaining the composition. The above-indicated material also has a relatively high piezoelectric constant, and is favorably used to form the piezoelectric/electrostrictive layer by thick-film forming process such as screen printing, spraying, dipping and coating. While such a multicomponent piezoelectric/electrostrictive material has piezoelectric characteristics which vary depending upon the composition of the components, a three-component material composed of lead magnesium niobate, lead zirconate and lead titanate, which is favorably employed to practice the invention, preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly desirable to employ the composition containing 15–50 mole % of lead magnesium niobate, 10–45 mole % of lead zirconate and 30–45 mole % of lead titanate.

The Piezoelectric/electrostrictive portion consisting of the electrode films and the piezoelectric/electrostrictive layer generally has a thickness not larger than 100 μm. To assure a relatively large amount of displacement by application of a relatively low voltage, the thickness of the piezoelectric/electrostrictive layer is preferably not larger than 50 μm, more preferably within a range of 3–40 μm.

Specimens of the piezoelectric/electrostrictive actuator were prepared by using various kinds of material for respective substrates, and the properties of these specimens are indicated in TABLE 1 below. Each specimen used the substrate having a recess defining a thin-walled portion (16a) as shown in FIG. 3, which has a thickness of 10 μm. On this thin-walled portion, there was formed by screen printing a piezoelectric/electrostrictive layer of 30 μm in thickness, which is formed of a material including a mixture of lead magnesium niobate (PMN) and lead zirconate titanate (PZT) as a major component. This piezoelectric layer was then heat-treated at 1000° C. or higher. The size of the thin-walled portion of the substrate was 0.8 mm×3 mm. The fracture strength of the specimen was measured by positioning a probe having an end face area of 0.7 mm² (0.3 mmφ) on a central portion of the thin-walled portion, and applying a load to the probe in the direction perpendicular to the plane of the thin-walled portion. The amount of displacement of the actuator was measured when a voltage of DC30V was applied to the piezoelectric/electrostrictive layer.

TABLE 1

| Substrate Material | Fracture Strength*[1] | Reaction with P/E material*[2] | Displacement of Actuator (μm) |
|---|---|---|---|
| glass*[3] | <1 | — | <0.1 |
| $Al_2O_3$ | 5 | small | 0.5 |
| MgO | 3 | small | 0.2 |
| $Si_3N_4$ | 10 | medium | <0.1 |
| $ZrO_2$—$Y_2O_3$*[4] | 20 | none | 2.0 |
| $ZrO_2$—MgO*[5] | 10 | none | 1.0 |
| $ZrO_2$—$CeO_2$*[6] | 10 | none | 1.0 |

*[1](Kgf/cm²: 10 μm)
*[2]Piezoelectric/electrostrictive material
*[3]The substrate formed of glass has a thickness of 50 μm. This specimen was obtained by bonding a piezoelectric plate to the glass substrate by an adhesive, rather than by a film-forming method.
*[4]$ZrO_2$ stabilized with 3 mole % of $Y_2O_3$
*[5]$ZrO_2$ stabilized with 9 mole % of MgO
*[6]$ZrO_2$ stabilized with 12 mole % of $CeO_2$

TABLE 2

| Substrate Material | Fracture Strength*[1] | Reaction with P/E material*[2] | Displacement of Actuator (μm) |
|---|---|---|---|
| glass*[3] | <1 | — | <0.1 |
| $Al_2O_3$ | 5 | small | 0.5 |
| $ZrO_2$—$Y_2O_3$*[4] (Tetragonal) | 20 | none | 2.0 |
| $ZrO_2$—$Y_2O_3$*[5] (cubic) | 5 | none | 0.8 |
| $ZrO_2$—MgO*[6] | 10 | none | 1.0 |
| $ZrO_2$—$CeO_2$*[7] | 10 | none | 1.0 |

*[1](Kgf/cm²: 10 μm)
*[2]Piezoelectric/electrostrictive material
*[3]The substrate formed of glass has a thickness of 50 μm. This specimen was obtained by bonding a piezoelectric plate to the glass substrate by an adhesive, rather than by a film-forming method.
*[4]$ZrO_2$ stabilized with 3 mole % of $Y_2O_3$ and consisting essentially of a tetragonal crystal phase
*[5]$ZrO_2$ stabilized with 8 mole % of $Y_2O_3$ and consisting essentially of a cubic crystal phase
*[6]$ZrO_2$ stabilized with 9 mole % of MgO and consisting essentially of a cubic and tetragonal crystal phases
*[7]$ZrO_2$ stabilized with 12 mole % of $CeO_2$ and consisting essentially of cubic and tetragonal crystal phases

TABLE 3

| Substrate Material | Content(mol %) of Stabilizer | Principal*[1] crystal phase | Fracture Strength*[2] | Reaction with P/E material*[3] | Displacement of Actuator (μm) |
|---|---|---|---|---|---|
| $ZrO_2$—$Y_2O_3$*[4] | 8 | C | 5 | none | 0.8 |
| $ZrO_2$—$Y_2O_3$*[5] | 3 | T | 20 | none | 2.0 |
| $ZrO_2$—$Y_2O_3$*[6] | 4 | C + M | 13 | none | 1.7 |
| $ZrO_2$—$Y_2O_3$*[7] | 3 | C + T + M | 14 | none | 1.8 |
| $ZrO_2$—MgO*[8] | 9 | C + T | 10 | none | 1.5 |
| $ZrO_2$—$CeO_2$*[9] | 12 | C + T | 10 | none | 1.6 |

TABLE 3-continued

| Substrate Material | Content(mol %) of Stabilizer | Principal*¹ crystal phase | Fracture Strength*² | Reaction with P/E material*³ | Displacement of Actuator (μm) |
|---|---|---|---|---|---|
| glass*¹⁰ | — | — | <0.1 | — | <0.1 |
| Al₂O₃ (99%) | — | — | 5 | small | 0.5 |

*¹C: cubic phase T: tetragonal phase M: monoclinic phase
*²(kgf/cm²: 10 μm)
*³Piezoelectric/electrostrictive material
*⁴ZrO₂ fully stabilized with Y₂O₃
*⁵, *⁶, *⁷ZrO₂ partially stabilized with Y₂O₃
*⁸ZrO₂ partially stabilized with MgO
*⁹ZrO₂ partially stabilized with CeO₂
*¹⁰The substrates formed of glass and alumina were used in comparative examples. The substrate formed of glass has a thickness of 50 μm. This specimen was obtained by bonding a piezoelectric plate to the glass substrate by an adhesive, rather than by a film-forming method.

It will be understood from TABLES 1–3 that the stabilized zirconia is less likely to react with the piezoelectric-electrostrictive material, compared to other substrate materials, and that the use of the stabilized ZrO₂ for the substrate permits a relatively large amount of displacement of the actuator. Further, the substrate formed of the stabilized ZrO₂ exhibits a relatively high mechanical strength even with the small thickness thereof.

A similar test was conducted with respect to some specimens having different values of the surface roughness (Ra) of the substrate. It will be understood from the result of the test as indicated below in TABLE 4 that the substrates having the surface roughness (Ra) in the range of 0.03–0.9 μm exhibit excellent properties and thus provide actuators having excellent operating characteristics.

While the present invention has been described in its presently preferred embodiments with a certain degree of particularity, it is to be understood that the invention is not limited to the details of the illustrated embodiments, but may be embodied with various changes, modifications and improvements, which may occur to those skilled in the art, without departing from the scope of the present invention defined in the following claims.

TABLE 4

| Substrate Material | Content of Y₂O₃ (mol %) | Principal crystal phase *¹ | Adhesion strength*² (kg/cm²) | Surface roughness Ra (μm) | Fracture strength (kg/cm²)*³ | Displacement of Actuator (μm) |
|---|---|---|---|---|---|---|
| ZrO₂—Y₂O₃*⁴ | 3 | T | 15.5 | 0.10 | 20 | 1.8 |
| ZrO₂—Y₂O₃*⁵ | 3 | T | 22.5 | 0.35 | 20 | 2.0 |
| ZrO₂—Y₂O₃*⁶ | 3 | T | 27.0 | 0.60 | 17 | 1.7 |
| ZrO₂—Y₂O₃*⁷ | 3 | T | 2.0 | 0.02 | 20 | —*¹⁰ |
| ZrO₂—Y₂O₃*⁸ | 3 | T | 35.0 | 1.0 | 8 | 1.4 |

*¹C: cubic phase T: tetragonal phase M: monoclinic phase
*²Strength of adhesion of lower electrode to substrate
*³Fracture strength as measured with the thickness being 10 μm
*⁴, *⁵, *⁶, *⁷, *⁸ZrO₂ partially stabilized with Y₂O₃
*⁷, *⁸comparative examples wherein the surface roughness of the substrate is outside the range selected according to the present invention
*¹⁰Separation of the piezoelectric/electrostrictive portion from the substrate

What is claimed is:

1. A piezoelectric/electrostrictive element comprising:
a thin ceramic substrate; and
a piezoelectric/electrostrictive portion formed on said ceramic substrate by a film forming technique without glass such that the piezoelectric/electrostrictive portion directly contacts said ceramic substrate, said piezoelectric/electrostrictive portion consisting essentially of a plurality of electrodes, and at least one piezoelectric/electrostrictive layer which is heat-treated, wherein said ceramic substrate is formed of a material which includes as a major component zirconia having a crystal phase that is stabilized by addition of at least one compound selected from the group consisting of: yttrium oxide, ytterbium oxide, cerium oxide, calcium oxide and magnesium oxide.

2. A piezoelectric/electrostrictive element according to claim 1, wherein said at least one compound consists of yttrium oxide, said material of said ceramic substrate containing 1.0–30 mole % of yttrium oxide.

3. A piezoelectric/electrostrictive element according to claim 2, wherein said material of said ceramic substrate contains 1.5–6 mole % of yttrium oxide.

4. A piezoelectric/electrostrictive element according to claim 3, wherein said material of said ceramic substrate contains 2–4 mole % of yttrium oxide.

5. A piezoelectric/electrostrictive element according to claim 1, wherein said ceramic substrate has a thickness not larger than 50 μm.

6. A piezoelectric/electrostrictive element according to claim 1, wherein said ceramic substrate has an average crystal grain size of 0.05–3 μm.

7. A piezoelectric/electrostrictive element according to claim 1, wherein said material of said ceramic substrate further includes at least one of aluminum oxide, titanium oxide and clay.

8. A piezoelectric/electrostrictive element according to claim 1, wherein said at least one piezoelectric/electrostrictive layer is formed of a piezoelectric/electrostrictive material which includes as a major component a mixture of lead magnesium niobate, lead nickel niobate and lead zirconate titanate, or a mixture of lead magnesium niobate and lead zirconate titanate.

9. A piezoelectric/electrostrictive element according to claim 1, wherein said at least one piezoelectric/electrostrictive layer is formed of a piezoelectric/electrostrictive material which consists of a mixture of lead magnesium niobate, lead nickel niobate and lead zirconate titanate, or a mixture of lead magnesium niobate and lead zirconate titanate.

10. A piezoelectric/electrostrictive element according to claim 1, wherein each of said at least one piezoelectric/electrostrictive layer has a thickness not larger than 50 μm.

11. A piezoelectric/electrostrictive element according to claim 1, wherein said piezoelectric/electrostrictive portion has a thickness not larger than 100 μm.

12. A piezoelectric/electrostrictive element according to claim 1, wherein said piezoelectric/electrostrictive portion consists of a plurality of piezoelectric/electrostrictive units which are formed on said ceramic substrate such that said plurality of units are laminated on each other.

13. A piezoelectric/electrostrictive element according to claim 1, wherein said piezoelectric/electrostrictive portion consists of a plurality of piezoelectric/electrostrictive units which are formed on said ceramic substrate such that said plurality of units are disposed in parallel with each other on the substrate.

14. A piezoelectric/electrostrictive element according to claim 1, wherein said ceramic substrate has at least one recess which defines at least one thin-walled portions on which said piezoelectric/electrostrictive portion is formed.

15. A piezoelectric/electrostrictive element according to claim 1, wherein said ceramic substrate has a surface roughness (Ra) within a range of 0.03–0.9 μm.

16. A piezoelectric/electrostrictive element comprising:
   a thin ceramic substrate; and
   a piezoelectric/electrostrictive portion formed on said ceramic substrate by a film forming technique without glass such that the piezoelectric/electrostrictive portion directly contacts said ceramic substrate, said piezoelectric/electrostrictive portion consisting essentially of a plurality of electrodes, and at least one piezoelectric/electrostrictive layer which is heat-treated, wherein said ceramic substrate is formed of a material which includes as a major component zirconia having a crystal phase that is partially stabilized by addition of at least one compound selected from the group consisting of: yttrium oxide, cerium oxide, magnesium oxide and calcium oxide, said crystal phase consisting essentially of one of a tetragonal phase and a combination of at least two kinds of the tetragonal phase, a cubic phase and a monoclinic phase.

17. A piezoelectric/electrostrictive element according to claim 16, wherein said crystal phase of said ceramic substrate consists essentially of a combination of the cubic phase and the tetragonal phase.

18. A piezoelectric/electrostrictive element according to claim 16, wherein said ceramic substrate has a surface roughness (Ra) within a range of 0.03–0.9 μm.

19. A piezoelectric/electrostrictive element according to claim 16, wherein said at least one compound consists of yttrium oxide, said material of said ceramic substrate containing 2–7 mole % of yttrium oxide.

20. A piezoelectric/electrostrictive element according to claim 16, wherein said material of said ceramic substrate contains 2–4 mole % of yttrium oxide.

21. A piezoelectric/electrostrictive element according to claim 16, wherein said at least one compound consists of cerium oxide, said material of said ceramic substrate containing 6–16 mole % of cerium oxide.

22. A piezoelectric/electrostrictive element according to claim 16, wherein said at least one compound consists of magnesium oxide or calcium oxide, said material of said ceramic substrate containing 5–12 mole % of the magnesium oxide or the calcium oxide.

23. A piezoelectric/electrostrictive element according to claim 16, wherein said ceramic substrate has a thickness not larger than 50 μm.

24. A piezoelectric/electrostrictive element according to claim 16, wherein said ceramic substrate has an average crystal grain size of 0.05–3 μm.

25. A piezoelectric/electrostrictive element according to claim 24, wherein said average crystal grain size is not larger than 1 μm.

26. A piezoelectric/electrostrictive element according to claim 16, wherein a powder formed of said material of said ceramic substrate has an average crystal grain size not larger than 0.1 μm.

27. A piezoelectric/electrostrictive element according to claim 16, wherein said material of said ceramic substrate further includes at least one of aluminum oxide, titanium oxide and clay.

28. A piezoelectric/electrostrictive element according to claim 16, wherein said at least one piezoelectric/electrostrictive layer is formed of a piezoelectric/electrostrictive material which includes as a major component a mixture of lead magnesium niobate, lead nickel niobate and lead zirconate titanate, or a mixture of lead magnesium niobate and lead zirconate titanate.

29. A piezoelectric/electrostrictive element according to claim 16, wherein said at least one piezoelectric/electrostrictive layer is formed of a piezoelectric/electrostrictive material which consists of a mixture of lead magnesium niobate, lead nickel niobate and lead zirconate titanate, or a mixture of lead magnesium niobate and lead zirconate titanate.

30. A piezoelectric/electrostrictive element according to claim 16, wherein said piezoelectric/electrostrictive layer has a thickness not larger than 50 μm.

31. A piezoelectric/electrostrictive element according to claim 16, wherein said piezoelectric/electrostrictive portion has a thickness not larger than 100 μm.

32. A piezoelectric/electrostrictive element according to claim 16, wherein said piezoelectric/electrostrictive portion consists of a plurality of piezoelectric/electrostrictive units which are formed on said ceramic substrate such that said plurality of units are laminated on each other.

33. A piezoelectric/electrostrictive element according to claim 16, wherein said piezoelectric/electrostrictive portion consists of a plurality of piezoelectric/electrostrictive units which are formed on said ceramic substrate such that said plurality of units are disposed in parallel with each other on the substrate.

34. A piezoelectric/electrostrictive element according to claim 16, wherein said ceramic substrate has at least one recess which defines at least one thin-walled portions on which said piezoelectric/electrostrictive portion is formed.

35. A piezoelectric/electrostrictive element comprising:
   a thin ceramic substrate; and
   a piezoelectric/electrostrictive portion formed on said ceramic substrate by a film forming technique without glass such that the piezoelectric/electrostrictive portion directly contacts said ceramic substrate, said piezoelectric/electrostrictive portion consisting essentially of a plurality of electrodes, and at least one piezoelectric/electrostrictive layer which is heat-treated, wherein said ceramic substrate is formed of a material which includes as a major component zirconia having a crystal phase that is partially stabilized by addition of at least one compound selected from the group consisting of: yttrium oxide, cerium oxide, magnesium oxide and calcium oxide, said crystal phase consisting essentially of one of a tetragonal phase and a combination of at least two kinds of the tetragonal phase, a cubic phase and a monoclinic phase, said ceramic substrate having a surface roughness (Ra) within a range of 0.03–0.9 μm.

* * * * *